(12) United States Patent
Oh et al.

(10) Patent No.: US 8,298,744 B2
(45) Date of Patent: Oct. 30, 2012

(54) COATING MATERIAL FOR PHOTORESIST PATTERN AND METHOD OF FORMING FINE PATTERN USING THE SAME

(75) Inventors: Joon-Seok Oh, Seoul (KR); Ju-Young Kim, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 1183 days.

(21) Appl. No.: 12/110,864

(22) Filed: Apr. 28, 2008

(65) Prior Publication Data

US 2008/0286684 A1    Nov. 20, 2008

(30) Foreign Application Priority Data

May 18, 2007    (KR) .......................... 10-2007-0048762

(51) Int. Cl.
*G03C 1/00* (2006.01)
*G03F 7/00* (2006.01)
(52) U.S. Cl. .................................................. 430/270.1
(58) Field of Classification Search ............... 430/270.1, 430/273.1
See application file for complete search history.

(56) References Cited

U.S. PATENT DOCUMENTS

| | | | |
|---|---|---|---|
| 2004/0072098 A1 | 4/2004 | Kozawa et al. | |
| 2004/0121259 A1 | 6/2004 | Kozawa et al. | |
| 2005/0123851 A1 | 6/2005 | Shinbori et al. | |
| 2006/0073419 A1* | 4/2006 | Kozawa et al. | 430/311 |
| 2006/0141390 A1 | 6/2006 | Lee et al. | |
| 2008/0044759 A1* | 2/2008 | Ishibashi et al. | 430/270.1 |
| 2010/0272909 A1* | 10/2010 | Shinbori et al. | 427/386 |

FOREIGN PATENT DOCUMENTS

EP    1757989 A1 *    2/2007
(Continued)

OTHER PUBLICATIONS

WO03/056393—International PCT Abstract corresponding to 10-2004-0077688.

*Primary Examiner* — Cynthia Kelly
*Assistant Examiner* — Connie P Johnson
(74) *Attorney, Agent, or Firm* — F. Chau & Associates, LLC

(57) ABSTRACT

A coating material for a photoresist pattern includes a water-soluble polymer and an additive mixed with the water-soluble polymer. The additive may be at least one selected from the group represented by Formulas 1 and 2:

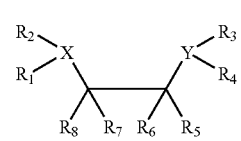

[Formula 1]

wherein X and Y respectively represent one selected from a heteroatom group consisting of N, O and S, and $R_1$ to $R_8$ respectively represent one selected from an electron donating group consisting of an alkyl group and —H, and

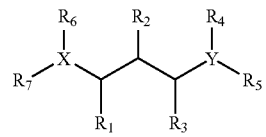

[Formula 2]

wherein X and Y respectively represent one selected from a heteroatom group consisting of N, O and S, and $R_1$ to $R_7$ respectively represent one selected from an electron donating group consisting of an alkyl group and —H.

3 Claims, 3 Drawing Sheets

FOREIGN PATENT DOCUMENTS

| | | |
|---|---|---|
| JP | 2004-77951 | 3/2004 |
| JP | 2004-126080 | 4/2004 |
| JP | 200664851 | 3/2006 |
| KR | 20040026128 | 3/2004 |
| KR | 20040030319 | 4/2004 |
| KR | 10-2004-0077688 | 9/2004 |
| KR | 10-2006-0074747 | 7/2006 |

\* cited by examiner

COATING MATERIAL FOR PHOTORESIST PATTERN AND METHOD OF FORMING FINE PATTERN USING THE SAME

CROSS-REFERENCE TO RELATED APPLICATION

This application claims the benefit of Korean Patent Application No. 10-2007-0048762, filed May 18, 2007, the contents of which are hereby incorporated by reference herein in their entirety.

BACKGROUND OF THE INVENTION

1. Technical Field

The present disclosure relates to a coating forming material, and more particularly, to a coating material for a photoresist pattern and a method of forming a fine pattern using the same.

2. Description of the Related Art

A plurality of patterning processes are employed in manufacturing electronic components such as a semiconductor device and a liquid crystal display (LCD). A technique including forming a photoresist pattern on a substrate, and forming a variety of fine patterns on the substrate using the photoresist pattern as an etch mask is employed in the patterning process. Research aiming at reducing the fine patterns to meet demand for light, thin, short and small electronic parts is underway.

The minimum size of the photoresist pattern may be determined by the resolution limit of an exposure apparatus. A technique for forming fine patterns smaller than the resolution limit of the exposure apparatus includes performing an annealing process to cause the photoresist pattern to flow. The flow depends on the volume of the photoresist pattern. That is, forming a plurality of photoresist patterns having different sizes on a substrate may result in difficulty in uniformly increasing or reducing the shape and size of the fine patterns. For example, the occurrence of overflow may cause a gap region between patterns to be buried.

Another technique for forming fine patterns smaller than the resolution limit of the exposure apparatus includes forming a coating layer on surfaces of photoresist patterns using a coating forming material.

Meanwhile, another method of forming a fine pattern using a coating forming material is described in U.S. Patent Publication No. U.S. 2005/0123851 entitled "Coating Material for Pattern Fineness Enhancement and Method for Forming Fine Pattern with the same" to Shinbori.

According to Shinbori, a coating forming material formed of a water-soluble polymer and a water-soluble cross-linking agent is provided. Also, a method of forming a fine pattern using the coating forming material is provided.

Meanwhile, the coating forming material should not melt the photoresist patterns and should readily remove the slurry left after reaction. The conventional water-soluble polymer has hydroxyl groups (—OH). The hydroxyl groups (—OH) can form intramolecular hydrogen bonding (Hb). The intramolecular hydrogen bonding (Hb) may serve as a crystallization point. In addition, the intramolecular hydrogen bonding (Hb) may inhibit the water-soluble polymer from being dissolved in water. In this case, a gap region between the photoresist patterns may be buried by a polymer slurry. That is, when slurries left after the reaction of the coating forming material remain on the photoresist patterns, defects such as contact hole clogging and micro-bridging between patterns may occur.

Furthermore, the hydroxyl groups (—OH) may cause difficulties with cross linking.

SUMMARY OF THE INVENTION

Exemplary embodiments of the present invention may provide a coating material for a photoresist pattern facilitating removal of slurries left after reaction.

Exemplary embodiments of the present invention may provide a method of forming a fine pattern using a coating material for a photoresist pattern.

In one exemplary embodiment, the present invention is directed to a coating material for a photoresist pattern.

In accordance with an exemplary embodiment of the present invention, a coating material for a photoresist pattern coating material is provided. The photoresist pattern coating material includes a water-soluble polymer and an additive mixed with the water soluble polymer. The additive being at least one selected from the group represented by Formulas 1 and 2:

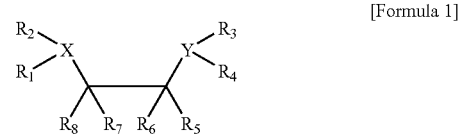

[Formula 1]

wherein X and Y respectively represent one selected from a heteroatom group consisting of N, O and S, and $R_1$ to $R_8$ respectively represent one selected from an electron donating group consisting of an alkyl group and —H; and

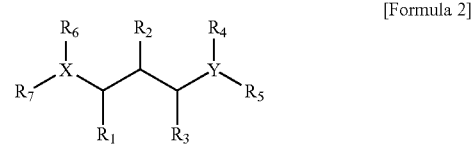

[Formula 2]

wherein X and Y respectively represent one selected from a heteroatom group consisting of N, O and S, and $R_1$ to $R_7$ respectively represent one selected from an electron donating group consisting of an alkyl group and —H.

In accordance with an exemplary embodiment of the present invention, a coating material for a photoresist pattern is provided. The coating material includes a water-soluble polymer, a cross-linking agent, an additive and water and wherein the water-soluble polymer, the cross-linking agent, the additive and water are mixed together. The additive being at least one selected from the group represented by Formulas 1 and 2:

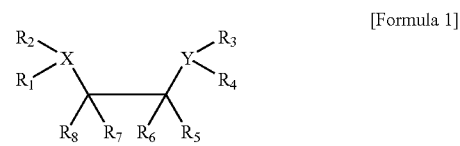

[Formula 1]

wherein X and Y respectively represent one selected from a heteroatom group consisting of N, O and S, and $R_1$ to $R_8$ respectively represent one selected from an electron donating group consisting of an alkyl group and —H; and

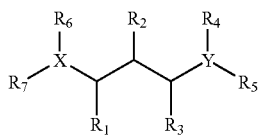

[Formula 2]

wherein X and Y respectively represent one selected from a heteroatom group consisting of N, O and S, and $R_1$ to $R_7$ respectively represent one selected from an electron donating group consisting of an alkyl group and —H.

In accordance with another exemplary embodiment of, the present invention, a method of forming a fine pattern is provided. The method includes preparing a coating material which includes a water-soluble polymer and an additive mixed with the water-soluble polymer, applying the coating material onto a substrate having photoresist patterns and cross-linking the coating material and the photoresist patterns to form coating patterns on the photoresist patterns. The additive being at least one selected from the group represented by Formulas 1 and 2:

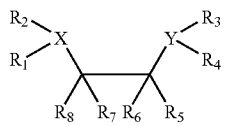

[Formula 1]

wherein X and Y respectively represent one selected from a heteroatom group consisting of N, O and S, and $R_1$ to $R_8$ respectively represent one selected from an electron donating group consisting of an alkyl group and —H; and

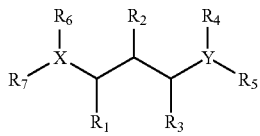

[Formula 2]

wherein X and Y respectively represent one selected from a heteroatom group consisting of N, O and S, and $R_1$ to $R_7$ respectively represent one selected from an electron donating group consisting of an alkyl group and —H.

In some exemplary embodiments, after forming the coating patterns, the coating material that does not react may be removed to expose the substrate between the photoresist patterns. The exposed substrate may be etched using the coating patterns and the photoresist patterns as etch masks.

In other exemplary embodiments, before forming the photoresist patterns, a hard mask layer may be formed on the substrate. The hard mask layer may be formed of a pad oxide layer covering the substrate and a mask nitride layer covering the pad oxide layer.

In still other exemplary embodiments, after forming the coating patterns, the coating material that does not react may be removed to expose the hard mask layer between the photoresist patterns. The exposed hard mask layer may be etched using the coating patterns and the photoresist patterns as etch masks to form hard mask patterns. The substrate may be etched using the hard mask patterns as etch masks.

BRIEF DESCRIPTION OF THE DRAWINGS

Exemplary embodiments of the present invention can be understood in more detail from the following description taken in conjunction with the accompanying drawing in which.

DETAILED DESCRIPTION OF THE EXEMPLARY EMBODIMENTS OF THE INVENTION

Figure 1:
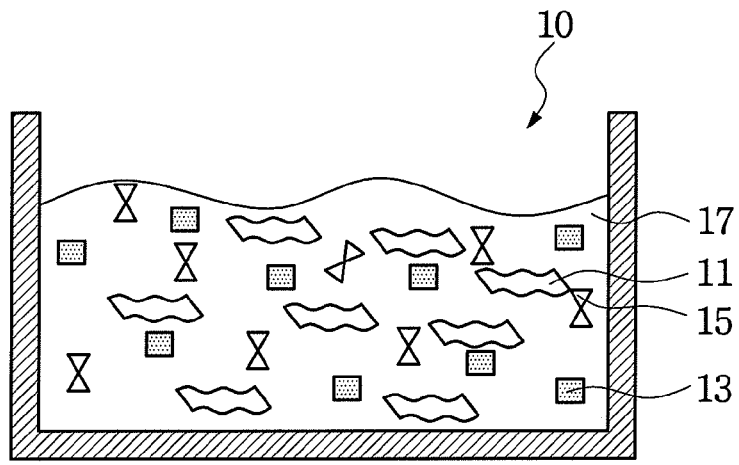
FIGS. 1 to 6 are cross-sectional views illustrating a method of forming a fine pattern using a coating material for a photoresist pattern according to exemplary embodiments of the present invention.

The present invention will now be described more fully hereinafter with reference to the accompanying drawings, in which preferred embodiments of the invention are shown. This invention may, however, be embodied in different forms and should not be construed as limited to the embodiments set forth herein. In the drawings, the thickness of layers and regions may be exaggerated for clarity. Like reference numerals designate like elements throughout the specification.

First, a coating material for a photoresist pattern according to an exemplary embodiment of the present invention may include a water-soluble polymer and an additive. The additive may be at least one selected from the group represented by Formulas 1 and 2:

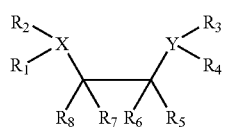

[Formula 1]

wherein X and Y respectively represent one selected from a heteroatom group consisting of N, O and S, and $R_1$ to $R_8$ respectively represent one selected from an electron donating group consisting of an alkyl group and —H; and

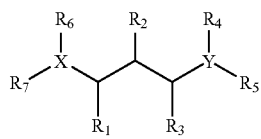

[Formula 2]

wherein X and Y respectively represent one selected from a heteroatom group consisting of N, O and S, and $R_1$ to $R_7$ respectively represent one selected from an electron donating group consisting of an alkyl group and —H.

For example, the additive may be at least one selected from the group consisting of 2-(methylamino)ethanol, 2-(dimethylamino)ethanol, 2-methoxy-N-methylethanamine, 2-methoxy-N,N-dimethylethanamine, 2-ethoxy-N-methylethanamine, 2-ethoxy-N,N-dimethylethanamine, N-methyl-2-propoxyethanamine, N,N-dimethyl-2-propoxyethanamine, 2-isopropoxy-N-methylethanamine, 2-isopropoxy-N,N-dimethylethanamine, N-ethyl-2-isopropoxyethanamine, 2-(ethylamino)ethanol, N-ethyl-2-methoxyethanamine, 2-ethoxy-N-ethylethanamine, N,N-diethyl-2-isopropoxyethanamine, N,N-diethyl-2-methoxyethanamine, 2-ethoxy-N,N-diethylethanamine, 2-(diethylamino)ethanol, 2-isopropoxyethanamine, 2-methoxyethanamine, 2-ethoxyethanamine, 2-aminoethanol, 2-aminoethanethiol, 2-(methylthio)ethanamine, 2-(ethylthio)ethanamine, 2-(isopropylthio)ethanamine, 2-(isopropylthio)ethanamine, 2-(methylamino)ethanethiol, N-methyl-2-(methylthio)ethanamine, 2-(ethylthio)-N-methylethanamine, 2-(isopropylthio)-N-methylethanamine, 2-(isopropylthio)-N-methylethanamine, 2-(ethylamino)ethanethiol, N-ethyl-2-(methylthio)ethanamine, N-ethyl-2-(ethylthio)ethanamine, N-ethyl-2-(isopropylthio)ethanamine, N-ethyl-2-(isopropylthio)ethanamine, 2-(diethylamino)ethanethiol, N,N-diethyl-2-(methylthio)ethanamine, N,N-diethyl-2-(ethylthio)ethanamine, N,N-diethyl-2-(isopropylthio)ethanamine, and N,N-diethyl-2-(isopropylthio)ethanamine.

The water-soluble polymer may be represented by the following Formula 3:

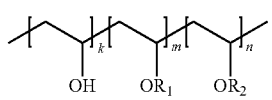

[Formula 3]

wherein $R_1$ and $R_2$ respectively represent one selected from an electron donating group consisting of an alkyl group and —H, and k, m and n respectively represent an integer of 1 to 100.

For example, $R_1$ may be acetyl, and $R_2$ may be acetal in Formula 3.

The water-soluble polymer may exhibit high solubility characteristics, and for example, may have hydroxyl groups as represented by Formula 4:

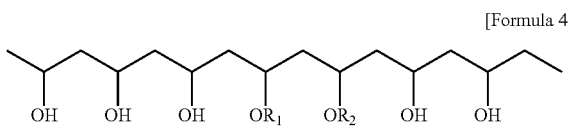

[Formula 4]

Meanwhile, the hydroxyl groups may form intramolecular hydrogen bonding (Hb) as represented by Formula 5. The intramolecular hydrogen bonding (Hb) may act as a crystallization point. Accordingly, the intramolecular hydrogen bonding (Hb) may inhibit the water-soluble polymer from being dissolved in water. In this case, a gap region between photoresist patterns may be buried by a polymer slurry. Also, the polymer slurry may cause a defect such as, for example, contact hole clogging.

Furthermore, the hydroxyl (—OH) groups may cause difficulties with cross-linking.

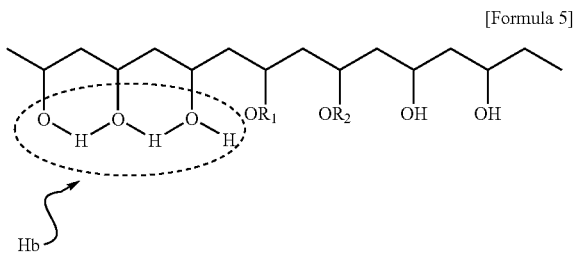

[Formula 5]

As described above, the photoresist pattern coating material is formed of the water-soluble polymer and the additive. For example, the photoresist pattern coating material may be represented by Formula 6. The additive may have polar characteristics. Accordingly, the additive may act to deteriorate the intramolecular hydrogen bonding (Hb). Therefore, the solubility of the photoresist pattern coating material with respect to water may be significantly enhanced.

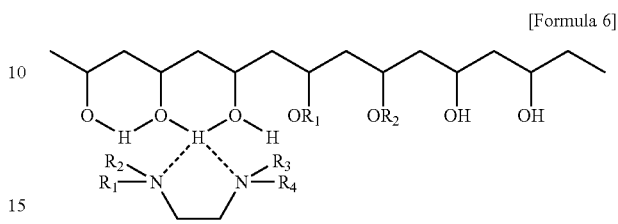

[Formula 6]

The photoresist pattern coating material according to an exemplary embodiment of the present invention may include a water-soluble polymer, a cross-linking agent, an additive, and water.

The water-soluble polymer may be represented by Formula 3. The additive may be at least one selected from the group represented by Formulas 1 and 2.

The cross-linking agent may be a water-soluble material which causes cross-linking by the action of heat or acid. For example, the cross-linking agent may be an amino-based cross-linking agent. The amino-based cross-linking agent may be at least one selected from the group consisting of a melamine derivative, a urea derivative and an uril derivative. These may be used alone, or two or more may be used in combination as the cross-linking agent.

Examples of the urea derivative include but are not limited to urea, alkoxymethylene urea, N-alkoxymethylene urea, ethylene urea, ethylene urea carboxylic acid, and their derivatives. Examples of the melamine derivative include but are not limited to alkoxymethyl melamine, and their derivatives. Examples of the uril derivative include but are not limited to benzoguanamine, glycol uril, and their derivatives.

A method of forming a fine pattern using a coating material for a photoresist pattern according to exemplary embodiments of the present invention will now be described with reference to FIGS. 1 to 6.

Referring to FIG. 1, a coating material for a photoresist pattern 10 including a water-soluble polymer 11 and an additive 13 is prepared. The photoresist pattern coating material 10 may be one disclosed in the exemplary embodiments of the present invention. That is, the photoresist pattern coating material 10 may be manufactured, for example, by mixing the water-soluble polymer 11 with the additive 13. Also, the photoresist pattern coating material 10 may be manufactured, for example, by mixing the water-soluble polymer 11, the additive 13, a cross-linking agent 15, and water 17. The water-soluble polymer 11, the additive 13, the cross-linking agent 15, and the water 17 are the same as the materials disclosed in exemplary embodiments of the present invention. Hereinafter, the photoresist pattern coating material 10 will be referred to as a coating material 10.

Figure 2:
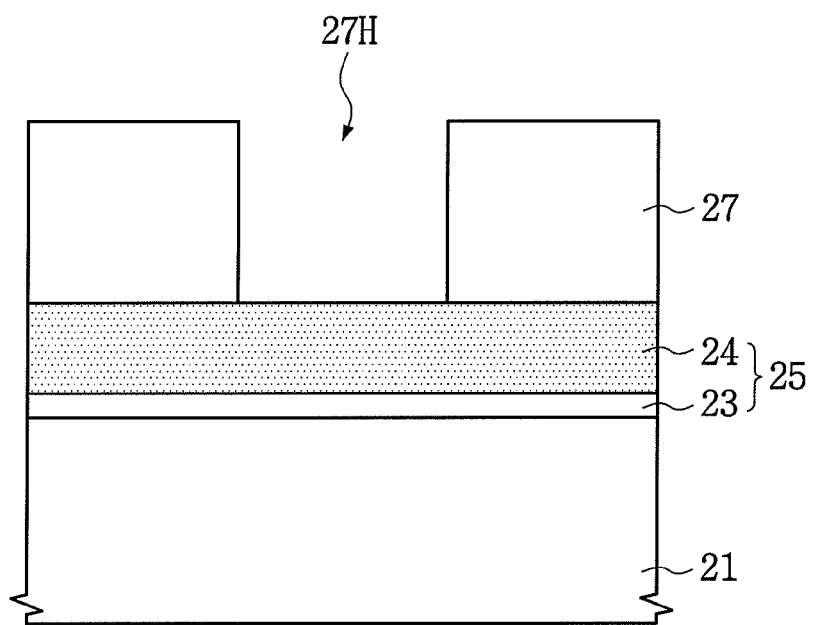

Referring to FIG. 2, a hard mask layer 25 may be formed on a substrate 21. The substrate 21 may be a semiconductor substrate such as, for example, a silicon wafer. The hard mask layer 25 may be formed of, for example, a silicon oxide layer, a silicon nitride layer, a silicon oxynitride layer, or a combination thereof. While a plurality of different material layers such as an interlayer insulating layer and/or a conductive layer may be additionally formed on the substrate 21, the description will be omitted for clarity.

For example, the hard mask layer 25 may be formed by sequentially stacking a pad oxide layer 23 and a mask nitride layer 24. For example, the pad oxide layer 23 that is formed of a silicon oxide layer 21 by a thermal oxidation method may be formed on the substrate. The mask nitride layer 24 formed of a silicon nitride layer by a chemical vapor deposition (CVD) method may be formed on the pad oxide layer 23. However, the hard mask layer 25 may be omitted.

Photoresist patterns 27 having a first opening 27H may be formed on the hard mask layer 25. The first opening 27H may be a gap region formed between the adjacent photoresist patterns 27. For example, the first opening 27H may be a contact hole, a trench and/or a groove. An upper surface of the hard mask layer 25 may be partially exposed in the first opening 27H.

The photoresist patterns 27 may be formed using a well-known photolithography process. In this case, the minimum size of the photoresist patterns 27 and the first opening 27H may be determined by the resolution limit of the photolithography process.

Figure 3:
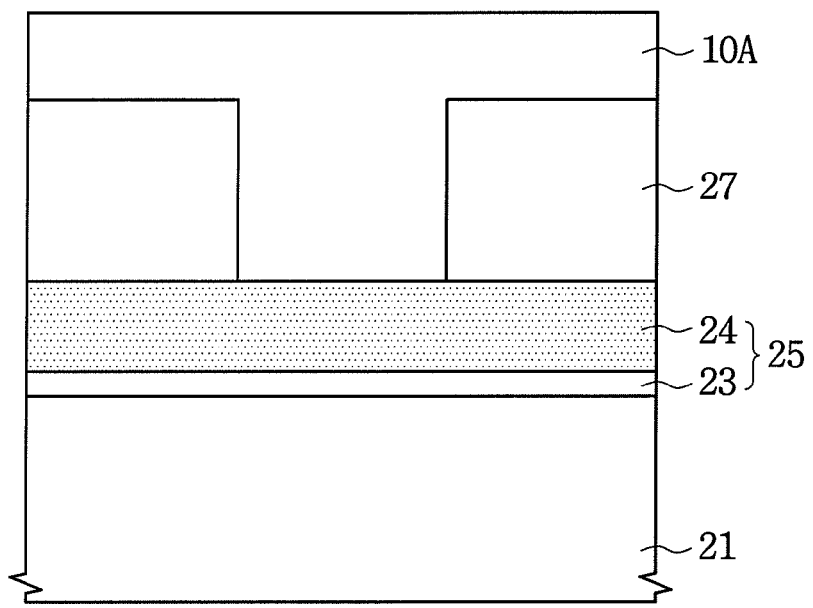

Referring to FIG. 3, the coating material 10 may be coated on the substrate 21 having the photoresist patterns 27. The coating material 10 may be coated using, for example, a spin coater. The coating material 10 may be coated on the first opening 27H and the photoresist patterns 27. A first bake process may be performed on the coated coating material 10 at a low temperature of about 50° C. to about 100° C. In this case, moisture in the coated coating material 10 is mostly evaporated, and then a coating layer 10A may be formed on the substrate 21. However, the first bake process may be omitted.

The coating layer 10A may be formed to fill the first opening 27H and cover the photoresist patterns 27. The coating layer 10A may be in contact with sidewalls and upper surfaces of the photoresist patterns 27.

Figure 4:
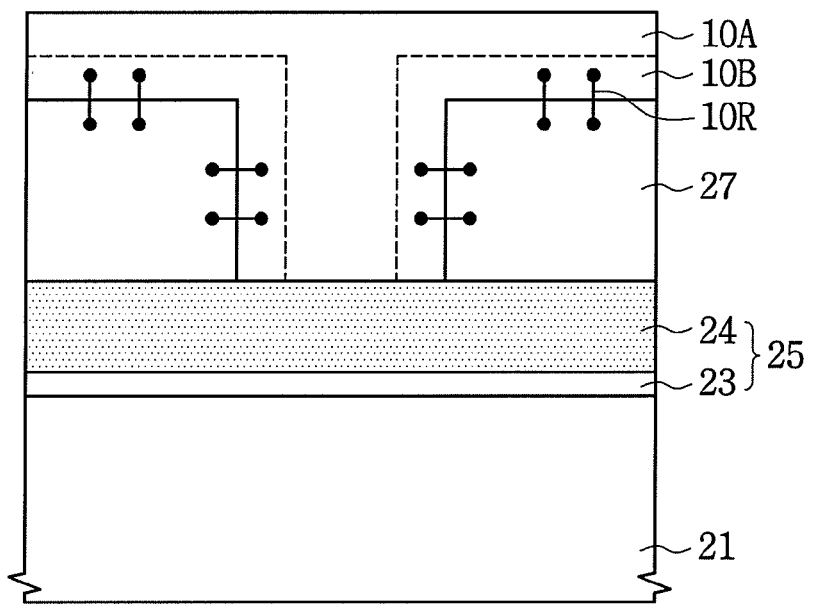

Referring to FIG. 4, coating patterns 10B covering the photoresist patterns 27 may be formed by cross-linking 10R the coating layer 10A with the photoresist patterns 27. The cross-linking 10R of the coating layer 10A and the photoresist patterns 27 may be carried out using a second bake process at a temperature of about 80° C. to about 250° C.

The coating patterns 10B may be formed along surfaces of the photoresist patterns 27. In this case, the coating layer 10A may partially remain in the first opening 27H. Also, the coating layer 10A may partially remain on the photoresist patterns 27.

Figure 5:
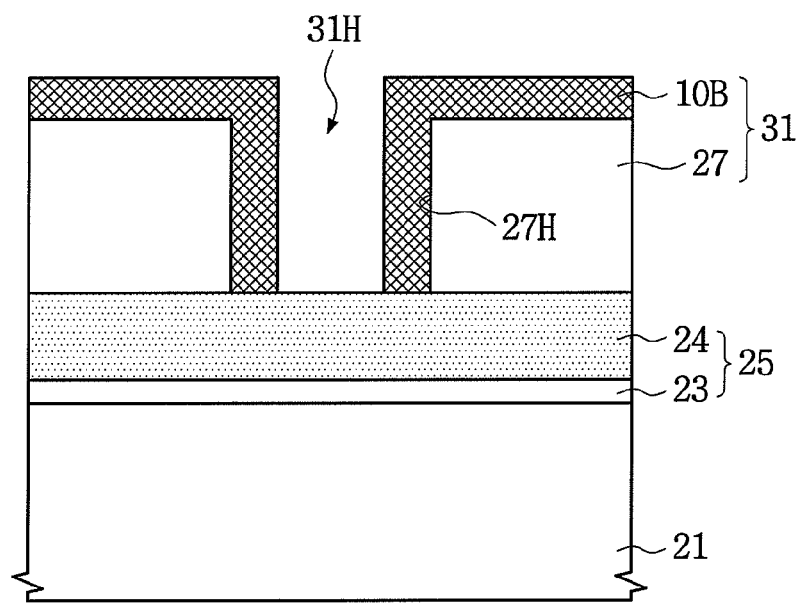

Referring to FIG. 5, the substrate 21 having the coating patterns 10B may be cleaned to remove the coating layer 10A. The cleaning is performed using D.I. water or distilled water. As a result, the coating patterns 10B may remain on sidewalls and upper surfaces of the photoresist patterns 27.

Accordingly, the first opening 27H may be reduced to form a second opening 31H. The second opening 31H may be adjusted by the thickness of the coating patterns 10B. When the size of the first opening 27H is close to the resolution limit of the photolithography process, the second opening 31H may be formed to a smaller size than the resolution limit of the photolithography process.

The coating patterns 10B and the photoresist patterns 27 may constitute mask patterns 31. That is, the mask patterns 31 and the second opening 31H may be formed on the hard mask layer 25. The hard mask layer 25 may be exposed in the second opening 31H.

Figure 6:
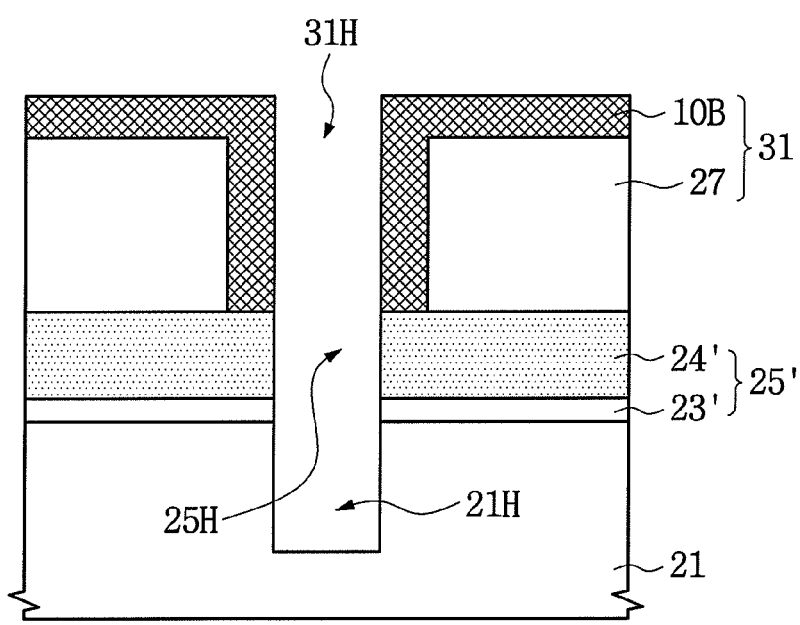

Referring to FIG. 6, the exposed hard mask layer 25 may be etched using the mask patterns 31 as etch masks to form hard mask patterns 25' having a third opening 25H. When the hard mask layer 25 is formed of the pad oxide layer 23 and the mask nitride layer 24, which are sequentially stacked, the hard mask patterns 25' may be formed of pad oxide patterns 23' and mask nitride patterns 24', which are sequentially stacked. The substrate 21 may be exposed in the third opening 25H.

The hard mask layer 25 may be etched by, for example, an anisotropic etching process. In this case, the size of the third opening 25H may be determined by the second opening 31H. That is, the third opening 25H may be formed to a smaller size than the resolution limit of the photolithography process.

The exposed substrate 21 may be etched using the mask patterns 31 and the hard mask patterns 25' as etch masks to form a fourth opening 21H. The exposed substrate 21 may be etched by an anisotropic etching process. In this case, the size of the fourth opening 21H may be determined by the third opening 25H. That is, the fourth opening 21H may be formed to a smaller size than the resolution limit of the photolithography process.

Alternatively, before forming the fourth opening 21H, the mask patterns 31 may be removed. In this case, the fourth opening 21H may be formed using the hard mask patterns 25' as etch masks.

As described above, the coating material 10 according to exemplary embodiments of the present invention may exhibit beneficial solubilities. Accordingly, slurries of the coating material 10 may be completely removed from the second opening 31H. Also, the coating patterns 10B may be controlled to have a uniform thickness on the entire surface of the substrate 21. As a result, the third opening 25H and the fourth opening 21H may be formed to have the desired size and shape. That is, fine patterns smaller than the resolution limit of the photolithography process may be formed.

As described above, a coating material for a photoresist pattern including a water-soluble polymer and an additive is provided. The additive may act to deteriorate intramolecular hydrogen bonding (Hb) of the water-soluble polymer. Therefore, the dissolubility of the photoresist pattern coating material with respect to water may be significantly increased.

Also, a method of forming a fine pattern using the photoresist pattern coating material according to exemplary embodiments of the present invention is provided. Accordingly, fine patterns such as a contact hole, a trench and/or a groove may be formed to have the desired size or shape.

Having described the exemplary embodiments of the present invention, it is readily apparent to those of reasonable skill in the art that various modifications can be made without departing from the spirit and scope of the present invention which is defined by the metes and bounds of the appended claims.

What is claimed is:

1. A coating material for a photoresist pattern comprising:
a water-soluble polymer; and
an additive mixed with the water-soluble polymer,
wherein the additive is at least one selected from the group consisting of 2-(methylamino)ethanol, 2-methoxy-N-methylethanamine, 2-methoxy-N,N-dimethylethanamine, 2-ethoxy-N-methylethanamine, 2-ethoxy-N,N-dimethylethanamine, N-methyl-2-propoxyethanamine, N,N-dimethyl-2-propoxyethanamine, 2-isopropoxy-N-methylethanamine, 2-isopropoxy-N,N-dimethylethanamine, N-ethyl-2-isopropoxyethanamine, 2-(ethylamino)ethanol, N-ethyl-2-methoxyethanamine, 2-ethoxy-N-ethylethanamine, N,N-diethyl-2-isopropoxyethanamine, N,N-diethyl-2-methoxyethanamine, 2-ethoxy-N,N-diethylethanamine, 2-(diethylamino)ethanol, 2-isopropoxyethanamine, 2-methoxyethanamine, 2-ethoxyethanamine, 2-aminoethanol, 2-aminoethanethiol, 2-(methylthio)ethanamine, 2-(ethylthio)ethanamine, 2-(isopropylthio)ethanamine, 2-(isopropylthio)ethanamine, 2-(methylamino)ethanethiol, N-methyl-2-(methylthio)ethanamine, 2-(ethylthio)-N-methylethanamine, 2-(isopropylthio)-N-methylethanamine, 2-(isopropylthio)-N-methylethanamine, 2-(ethylamino)ethanethiol, N-ethyl-2-(methylthio)ethanamine, N-ethyl-2-(ethylthio)ethanamine, N-ethyl-2-(isopropylthio)ethanamine, N-ethyl-2-(isopropylthio)ethanamine, 2-(diethylamino)ethanethiol, N,N-diethyl-2-(methylthio)ethanamine, N,N-diethyl-2-(ethylthio)ethanamine, N,N-diethyl-2-(isopropylthio)ethanamine, and N,N-diethyl-2-(isopropylthio)ethanamine, wherein the water-soluble polymer is represented by Formula 3:

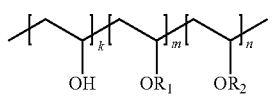

[Formula 3]

wherein k, m and n respectively represent an integer of 1 to 100, and wherein $R_1$ is acetyl, and $R_2$ is acetal.

2. A coating material for a photoresist pattern comprising:
a water-soluble polymer;
a cross-linking agent;
an additive; and
water, and wherein the water, the water-soluble polymer, the cross-linking agent and the additive are mixed together,
wherein the additive is at least one selected from the group consisting of 2-(methylamino)ethanol, 2-methoxy-N-methylethanamine, 2-methoxy-N,N-dimethylethanamine, 2-ethoxy-N-methylethanamine, 2-ethoxy-N,N-dimethylethanamine, N-methyl-2-propoxyethanamine, N,N-dimethyl-2-propoxyethanamine, 2-isopropoxy-N-methylethanamine, 2-isopropoxy-N,N-dimethylethanamine, N-ethyl-2-isopropoxyethanamine, 2-(ethylamino)ethanol, N-ethyl-2-methoxyethanamine, 2-ethoxy-N-ethylethanamine, N,N-diethyl-2-isopropoxyethanamine, N,N-diethyl-2-methoxyethanamine, 2-ethoxy-N,N-diethylethanamine, 2-(diethylamino)ethanol, 2-isopropoxyethanamine, 2-methoxyethanamine, 2-ethoxyethanamine, 2-aminoethanol, 2-aminoethanethiol, 2-(methylthio)ethanamine, 2-(ethylthio)ethanamine, 2-(isopropylthio)ethanamine, 2-(isopropylthio)ethanamine, 2-(methylamino)ethanethiol, N-methyl-2-(methylthio)ethanamine, 2-(ethylthio)-N-methylethanamine, 2-(isopropylthio)-N-methylethanamine, 2-(isopropylthio)-N-methylethanamine, 2-(ethylamino)ethanethiol, N-ethyl-2-(methylthio)ethanamine, N-ethyl-2-(ethylthio)ethanamine, N-ethyl-2-(isopropylthio)ethanamine, N-ethyl-2-(isopropylthio)ethanamine, 2-(diethylamino)ethanethiol, N,N-diethyl-2-(methylthio)ethanamine, N,N-diethyl-2-(ethylthio)ethanamine, N,N-diethyl-2-(isopropylthio)ethanamine, and N,N-diethyl-2-(isopropylthio)ethanamine, wherein the water-soluble polymer is represented by Formula 3:

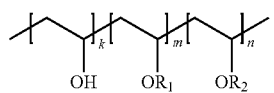

[Formula 3]

wherein k, m and n respectively represent an integer of 1 to 100, and wherein $R_1$ is acetyl, and $R_2$ is acetal.

3. The coating material of claim 2, wherein the cross-linking agent is at least one selected from the group consisting of a melamine derivative, a urea derivative and a uril derivative.

* * * * *